(12) United States Patent
Tsai et al.

(10) Patent No.: US 8,105,900 B2
(45) Date of Patent: Jan. 31, 2012

(54) MANUFACTURING METHOD OF NON-VOLATILE MEMORY

(75) Inventors: Hung-Mine Tsai, Kaohsiung (TW); Ching-Nan Hsiao, Kaohsiung County (TW); Chung-Lin Huang, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 12/838,495

(22) Filed: Jul. 19, 2010

(65) Prior Publication Data

US 2010/0279472 A1 Nov. 4, 2010

Related U.S. Application Data

(62) Division of application No. 12/101,164, filed on Apr. 11, 2008, now Pat. No. 7,781,804.

(30) Foreign Application Priority Data

Nov. 15, 2007 (TW) ................................ 96143269 A

(51) Int. Cl.
*H01L 21/336* (2006.01)
(52) U.S. Cl. ................. 438/257; 257/208; 257/E27.105
(58) Field of Classification Search .................. 257/202, 257/208, 211, 390, 391, E27.102, E27.105
See application file for complete search history.

(56) References Cited

U.S. PATENT DOCUMENTS

| | | | | |
|---|---|---|---|---|
| 5,936,887 A | * | 8/1999 | Choi et al. | 365/185.17 |
| 6,930,001 B2 | | 8/2005 | Gil | |
| 2008/0232183 A1 | * | 9/2008 | Maejima et al. | 365/205 |
| 2008/0305630 A1 | * | 12/2008 | Fukuhara | 438/664 |

OTHER PUBLICATIONS

"Office Action of Taiwan Counterpart Application", issued on Apr. 29, 2011, p. 1-p. 7, in which the listed reference was cited.

* cited by examiner

*Primary Examiner* — Ha Tran T Nguyen
*Assistant Examiner* — Vongsavanh Sengdara
(74) *Attorney, Agent, or Firm* — Jianq Chyun IP Office

(57) ABSTRACT

In a manufacturing method of a non-volatile memory, a substrate is provided, and strip-shaped isolation structures are formed in the substrate. A first memory array including memory cell columns is formed on the substrate. Each memory cell column includes memory cells connected in series with one another, a source/drain region disposed in the substrate outside the memory cells, select transistors disposed between the source/drain region and the memory cells, control gate lines extending across the memory cell columns and in a second direction, and first select gate lines respectively connecting the select transistors in the second direction in series. First contacts are formed on the substrate at a side of the first memory array and arranged along the second direction. Each first contact connects the source/drain regions in every two adjacent active regions.

6 Claims, 13 Drawing Sheets

MANUFACTURING METHOD OF NON-VOLATILE MEMORY

CROSS-REFERENCE TO RELATED APPLICATION

This application is a divisional of an application Ser. No. 12/101,164, filed on Apr. 11, 2008, now pending, which claims the priority benefit of Taiwan application serial no. 96143269, filed on Nov. 15, 2007. The entirety each of the above-mentioned patent applications is hereby incorporated by reference herein and made a part of specification.

BACKGROUND OF THE INVENTION

1. Field of the Invention

The invention relates to a manufacturing method of a semiconductor device. More particularly, the invention relates to a manufacturing method of a non-volatile memory.

2. Description of Related Art

Among various memory products, a non-volatile memory allows multiple data writing, reading and erasing operations. Moreover, data stored in the non-volatile memory will be retained even after power to the device is off. Hence, the non-volatile memory has become one of the most widely adopted memory devices for personal computers and electronic equipments.

In most cases, a plurality of memory cells is formed on one chip. The memory cells are arranged in rows and columns, and thereby a plurality of memory arrays is constructed. Moreover, voltages are transmitted to sources/drains of the memory arrays via bit lines, source lines, and contacts.

A conventional non-volatile memory usually requires an active region additionally formed between strip-shaped active regions and disposed on a location corresponding to the contacts. As a result, an active region 110 shaped as a letter H is formed as indicated in FIG. 1. A contact 180 is disposed on the H-shaped active region 110. To avoid shortage within the active region and misalignment during an implementation of a photolithography process, a great deal of time is often required for the photolithography process due to optical proximity correction, so as to form the H-shaped active region 110, thus increasing manufacturing difficulties and process cost. In addition, the disposition of the H-shaped active region 110 brings about an increase in distance between two adjacent select gate lines 124 and 144 of memory arrays 120 and 140, and a tolerance of the photolithography process should be provided for accommodating the H-shaped active region 110 and the contact 180. As such, the H-shaped active region 110 and the contact 180 occupy a significant area on the chip, posing a negative impact on miniaturization of the devices.

SUMMARY OF THE INVENTION

The invention is directed to a manufacturing method of a non-volatile memory. The manufacturing method is able to simplify a manufacturing process of the non-volatile memory by connecting source/drain regions of two adjacent active regions disposed in a substrate with use of contacts extending across isolation structures. Thereby, not only a chip area occupied by the contacts is reduced, but also a process window is increased.

The invention provides a manufacturing method of a non-volatile memory. In the manufacturing method, a substrate is firstly provided, and a plurality of strip-shaped isolation structures is formed in the substrate, so as to define a plurality of active regions. The isolation structures are parallel to the active regions. Besides, the isolation structures and the active regions are extended in a first direction. Thereafter, a first memory array including a plurality of memory cell columns is formed on the substrate. Each of the memory cell columns includes a plurality of memory cells, a source/drain region, a plurality of select transistors, a plurality of control gate lines, and a plurality of first select gate lines. The memory cells are connected in series with one another and disposed on the substrate at the active regions. The source/drain region is disposed in the substrate outside the memory cells. The select transistors are disposed between the source/drain region and the memory cells, so as to connect the memory cells to the source/drain region in series. The control gate lines extend across the memory cell columns and are extended in a second direction. The second direction is intersecting the first direction, and the control gate lines respectively connect the memory cells in the second direction in series. The first select gate lines extend across the active regions and respectively connect the select transistors in the second direction in series. Next, a plurality of first contacts is formed on the substrate at a side of the first memory array. The first contacts are arranged along the second direction, and each of the first contacts connects the source/drain regions in every two of the adjacent active regions.

According to an embodiment of the invention, the first contacts forming step includes forming an inter-layer dielectric layer on the substrate at first to cover the first memory array. A plurality of contact holes is then formed in the inter-layer dielectric layer. Each of the contact holes at least exposes a portion of the two source/regions in every two of the adjacent active regions and also exposes the isolation structure sandwiched between the two active regions. After that, the contact holes are filled with conductive materials.

According to an embodiment of the invention, a second memory array adjacent to the first memory array is further formed during the formation of the first memory array. The second memory array is mirror symmetrical to the first memory array with respect to the first contacts.

According to an embodiment of the invention, the second memory array includes a plurality of second select gate lines formed on the substrate and is symmetrical to the first select gate lines.

According to an embodiment of the invention, the first memory array and the second memory array share the source/drain region.

According to an embodiment of the invention, after the formation of the first memory array and the second memory array, the first contacts forming step includes forming a mask layer on the substrate at first to cover the first memory array and the second memory array. Next, a portion of the mask layer is removed, and a plurality of contact holes is then formed. The contact holes at least expose the source/drain region between the first memory array and the second memory array. Afterwards, the first contacts are formed through self-alignment.

In the manufacturing method of the non-volatile memory, the contacts extending across the isolation structures are formed, so as to connect the source/drain regions in the substrate at every two of the adjacent active regions. As such, the chip area occupied by the contacts can be significantly reduced, so as to promote miniaturization of the devices.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

FIG. 2A through FIG. 2E are top views illustrating a manufacturing process of a non-volatile memory according to an embodiment of the invention. FIG. 3A through FIG. 3E are structural cross-sectional views along a sectional line A-A' depicted in FIG. 2A through FIG. 2E. FIG. 4A through FIG. 4E are structural cross-sectional views along a sectional line B-B' depicted in FIG. 2A through FIG. 2E.

Figure 1:
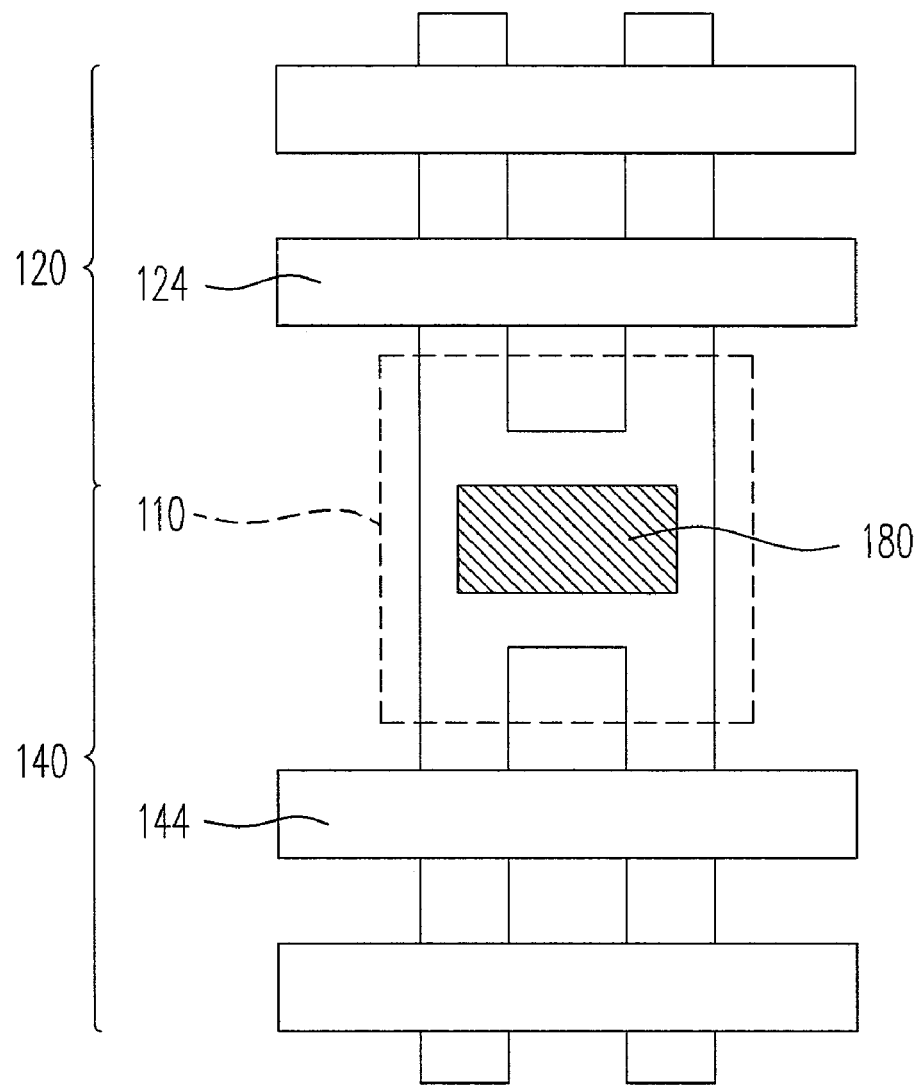
FIG. 1 is a top view of a conventional non-volatile memory.
Figure 2A:
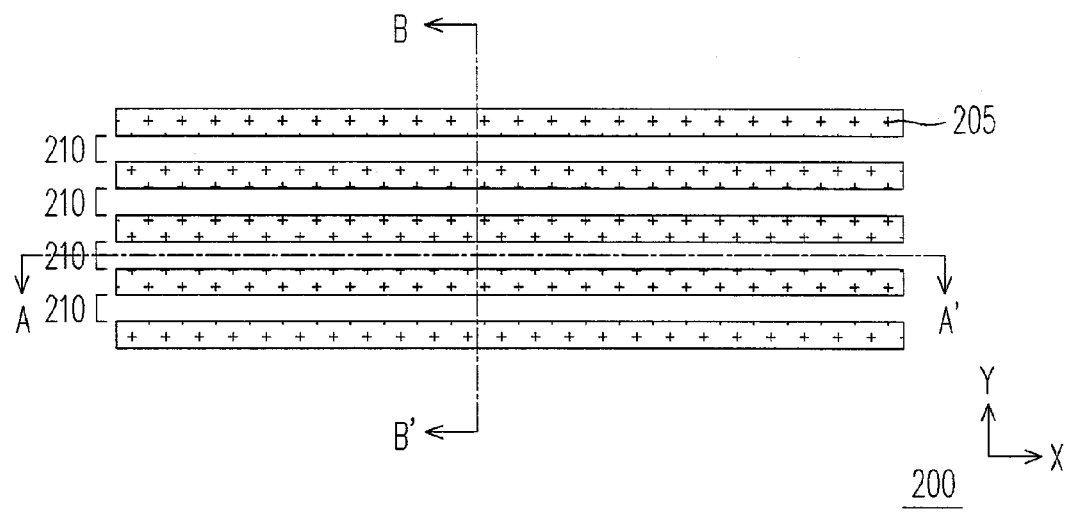
FIG. 2A through FIG. 2E are top views illustrating a manufacturing process of a non-volatile memory according to an embodiment of the invention.
Figure 3A:
FIG. 3A through FIG. 3E are structural cross-sectional views along a sectional line A-A' depicted in FIG. 2A through FIG. 2E.
Figure 4A:
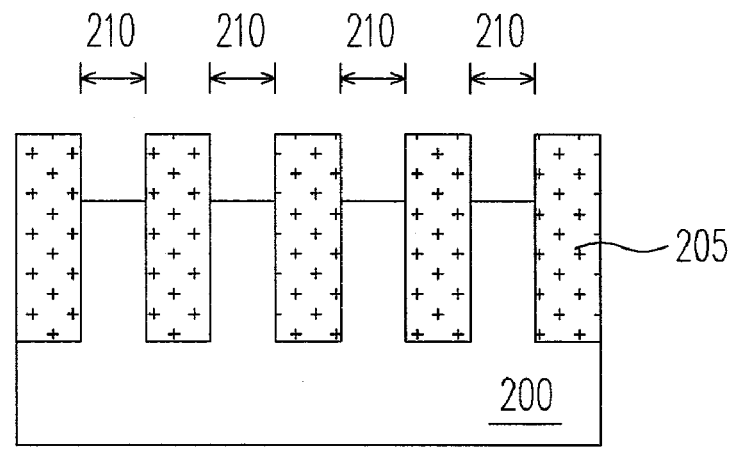
FIG. 4A through FIG. 4E are structural cross-sectional views along a sectional line B-B' depicted in FIG. 2A through FIG. 2E.

Referring to FIG. 2A, FIG. 3A and FIG. 4A, in the manufacturing method of the non-volatile memory according to the embodiment, a substrate 200 is firstly provided. The substrate 200 is, for example, a silicon substrate, an SOI substrate, or a group III-V semiconductor substrate. Next, a plurality of isolation structures 205 is formed in the substrate 200. The isolation structures 205 are, for example, field oxide layers or STI structures, and the method of forming the isolation structures 205 is well known to people skilled in the pertinent art. Hence, no further description in this regard is further provided. The isolation structures 205 of the embodiment are, for example, the STI structures. Besides, the isolation structures 205 are strip-shaped, and top surfaces of the isolation structures 205 are at a higher level than a top surface of the substrate 200. In addition, the strip-shaped isolation structures 205 define a plurality of strip-shaped active regions 210 between two adjacent strip-shaped isolation structures 205 and above the substrate 200. The isolation structures 205 are parallel to the active regions 210. Besides, the isolation structures 205 and the active regions 210 are extended in X direction (as shown in FIG. 2A).

Figure 2B:
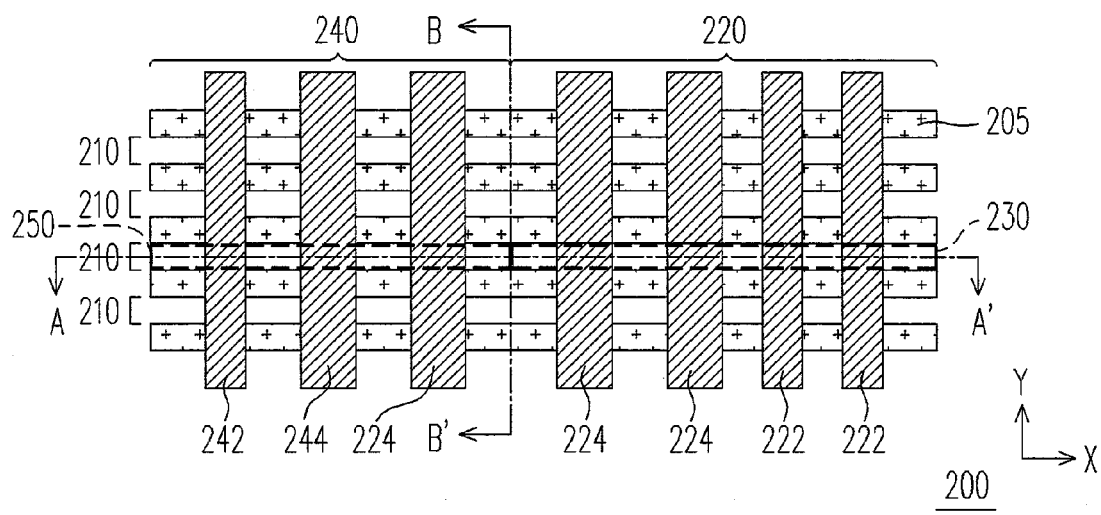

Thereafter, referring to FIG. 2B, a memory array 220 is formed on the substrate 200. The memory array 220 includes a plurality of memory cell columns 230, a plurality of control gate lines 222, and a plurality of select gate lines 224.

Figure 3B:
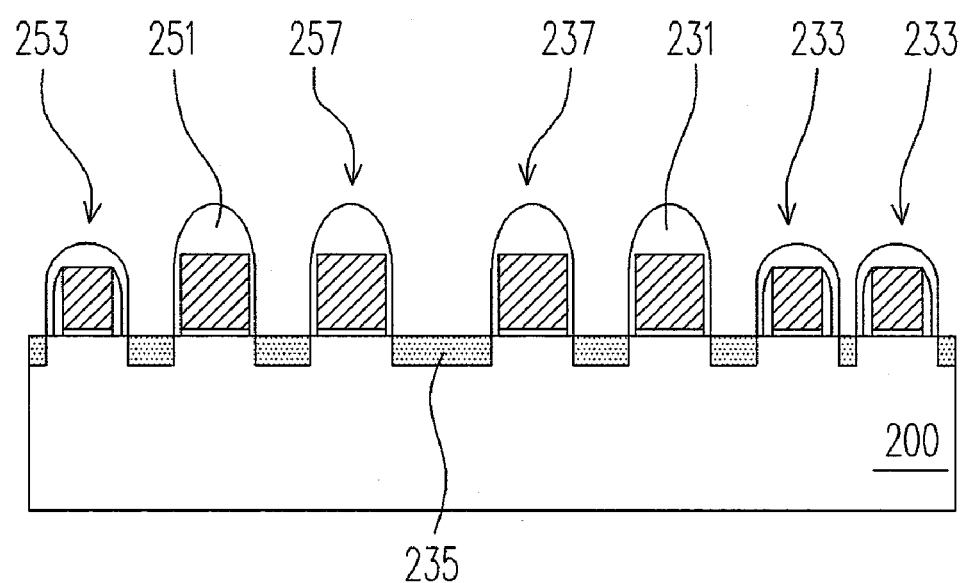

In FIG. 3B, each of the memory cell columns 230 includes a plurality of memory cells 233, a source/drain region 235, and a plurality of select transistors 237. The memory cells 233 are disposed on the substrate 200 at the active regions 210 and connected in series with one another, while the source/drain region 235 is disposed in the substrate 200 and outside the memory cells 233. The select transistors 237 are disposed between the source/drain region 235 and the memory cells 233, so as to connect the memory cells 233 to the source/drain region 235. Top portions of the select transistors 237 further include cap layers 231. The memory cell columns 230 are, for example, NAND memory cell columns.

Figure 4B:
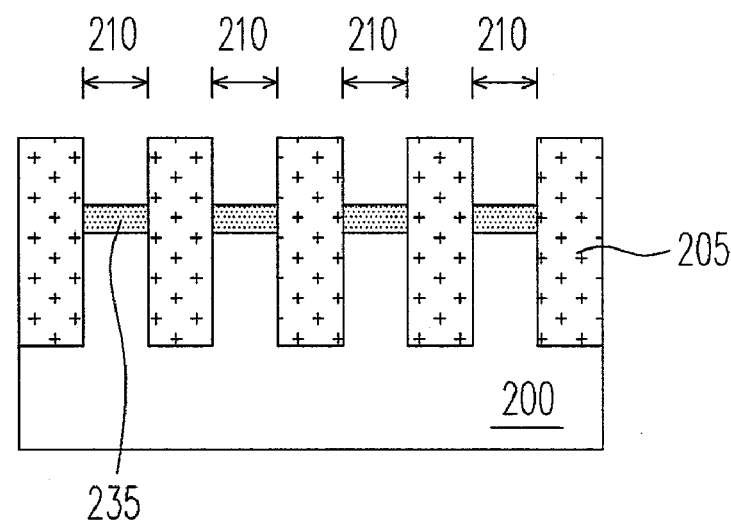

Referring to FIG. 4B, the source/drain region 235 is, for example, a p-type source/drain region having p-type dopant such as boron, $BF_2$, indium, and so forth. Alternatively, the source/drain region 235 is an n-type source/drain region having n-type dopant such as phosphorus, arsenic, and so on. The source/drain region 235 serves as a source or a drain of each of the memory cell columns 230, for example.

The memory cell 233, for example, has a stacked gate structure and includes charge trapping layers to trap electric charges. Various memory cells can be applied to the non-volatile memory of the invention as long as the memory cells are able to store data which are still retained even after power supply is cut off.

As indicated in FIG. 2B, a plurality of the control gate lines 222 extends across the memory cell columns 230 and is extended in Y-direction. The control gate lines 222 are respectively connected to the memory cells 233 in the Y-direction in series. Besides, referring to FIG. 3B, a plurality of select gate lines 224 extends across the active regions 210 and is connected to the select transistors 237 in the Y-direction in series.

As indicated in FIG. 2B, during the formation of the memory array 220, another memory array 240 adjacent to the memory array 220 is further formed. The memory array 240 and the memory array 220 have the same structure and are mirror symmetrical to each other. The memory array 240, for example, includes memory cell columns 250, control gate lines 242, and select gate lines 244. Each of the memory cell columns 250 includes memory cells 253 and select transistors 257 (as shown in FIG. 3B). According to one embodiment, as illustrated in FIG. 3B, each of the memory cell columns 250 in the memory array 240 and each of the memory cell columns 230 in the memory array 220 share the same source/drain region 235, for example.

The memory cell columns 230 and 250 depicted in FIG. 2B and FIG. 3B represent parts of the memory cell columns. The detailed structure and the manufacturing method of the memory cell columns 230 and 250 and the memory arrays 220 and 240 are deemed well known to people skilled in the pertinent art, and thus no further description in this regard is provided hereinafter.

Figure 2C:
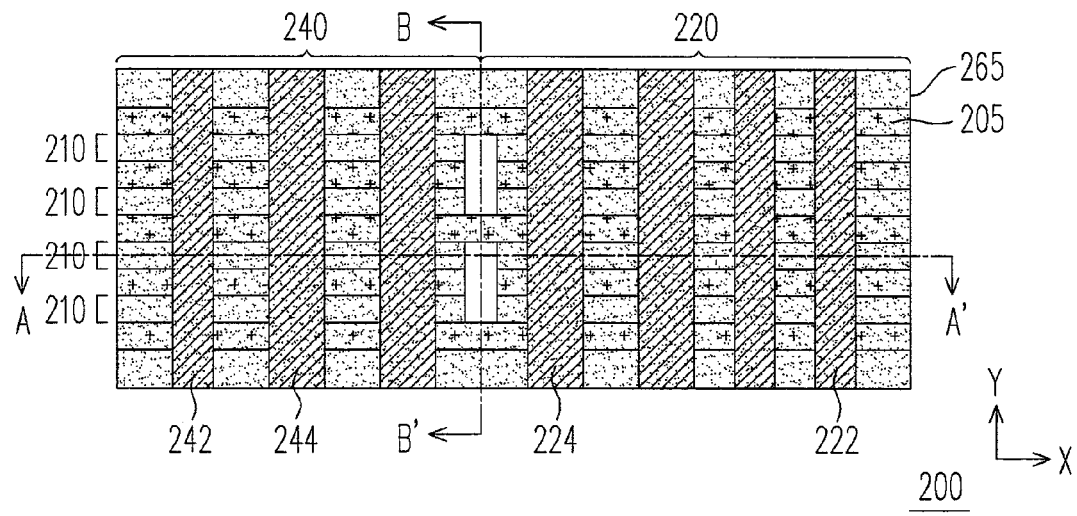
Figure 3C:
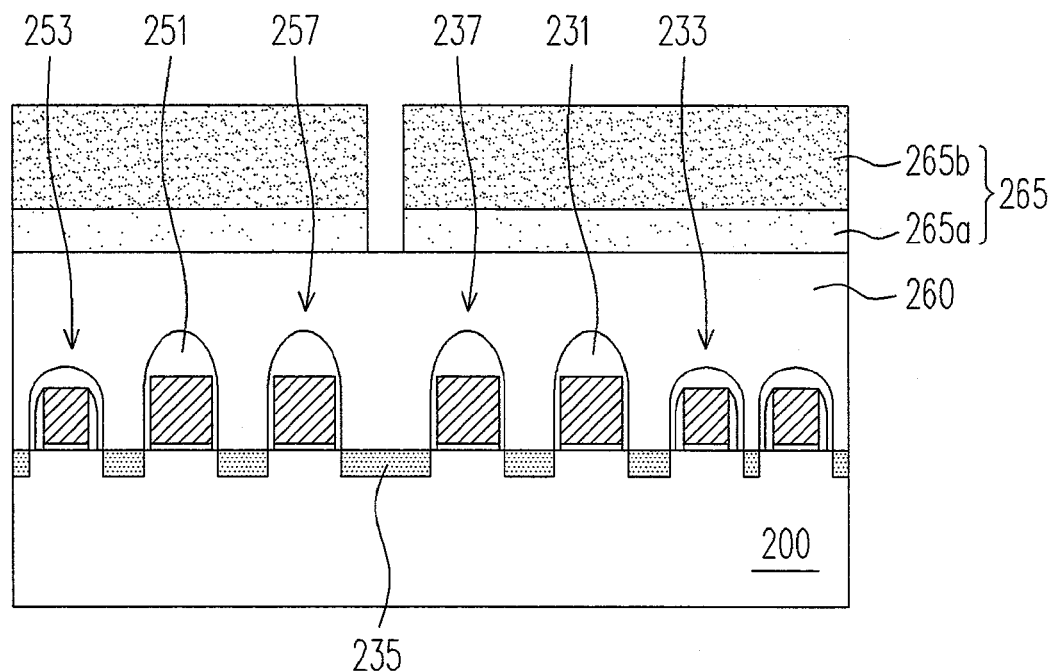
Figure 4C:
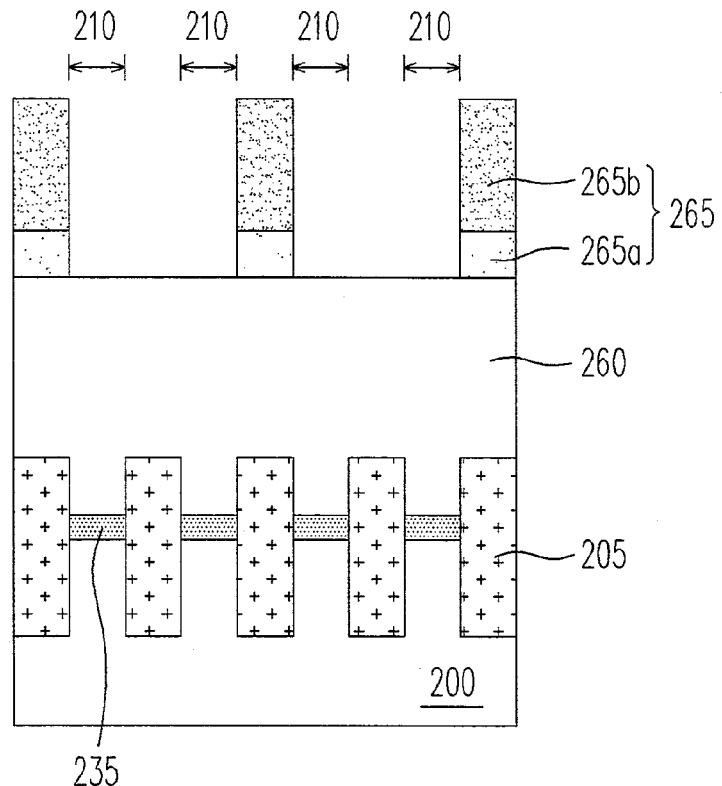

Next, referring to FIG. 2C, FIG. 3C and FIG. 4C, an inter-layer dielectric layer 260 is formed on the substrate 200. A material of the inter-layer dielectric layer 260 includes, for example, high density plasma (HDP) oxide or F-doped HDP oxide. Undoubtedly, the inter-layer dielectric layer 260 can also be constituted by multiple dielectric material layers, which is determined upon device demands.

Thereafter, a patterned mask layer 265 is formed on the inter-layer dielectric layer 260. In one embodiment, the patterned mask layer 265 is formed by firstly forming a hard mask layer 265a and a photoresist layer 265b in sequence. After that, a photolithography process is implemented to transfer to-be-formed contact patterns into the photoresist layer 265b. A portion of the hard mask layer 265a is then removed with use of the photoresist layer 265b as a mask, such that the patterned mask layer 265 is constructed. Here, a material of the hard mask layer 265a is polysilicon, and the method of forming the hard mask layer 265a is, for example, chemical vapor deposition (CVD). On the other hand, the photoresist layer 265b is, for example, a positive photoresist thin film formed by performing a spin-coating method. The method of removing the portion of the hard mask layer 265a is, for example, a dry etching method, such as a reactive ion etching method. The patterned mask layer 265 exposes a portion of the underlying inter-layer dielectric layer 260.

Figure 2D:
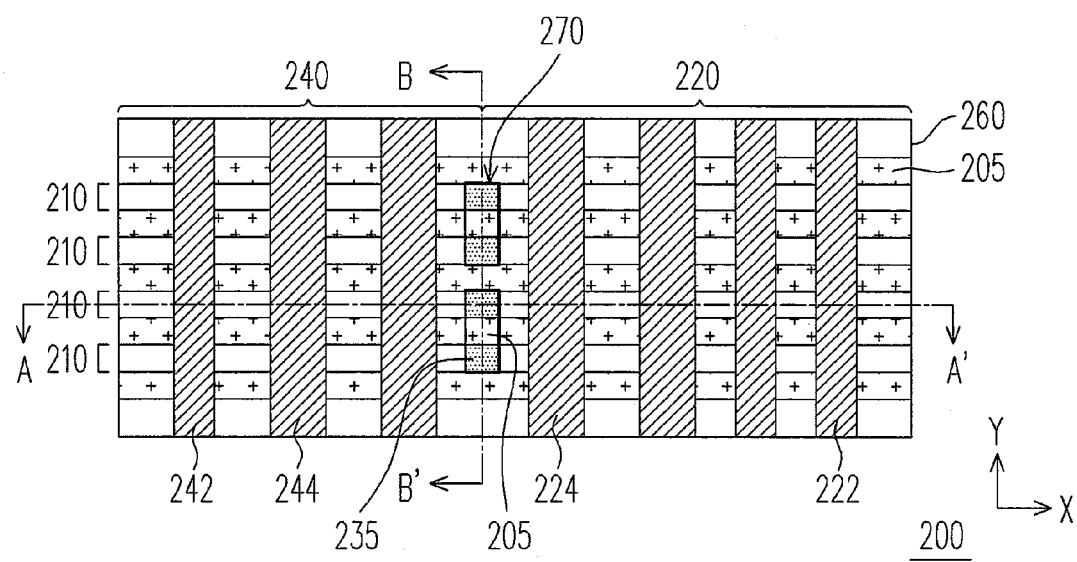
Figure 3D:
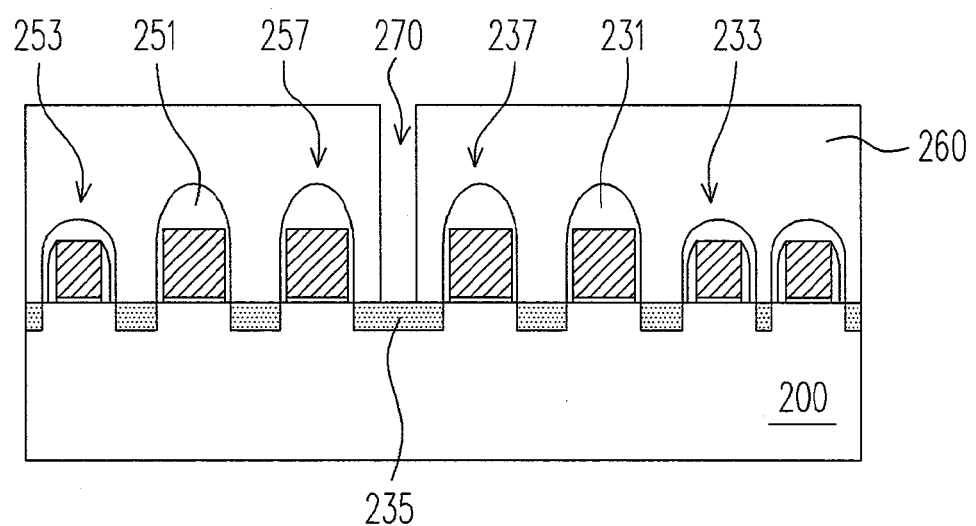
Figure 4D:
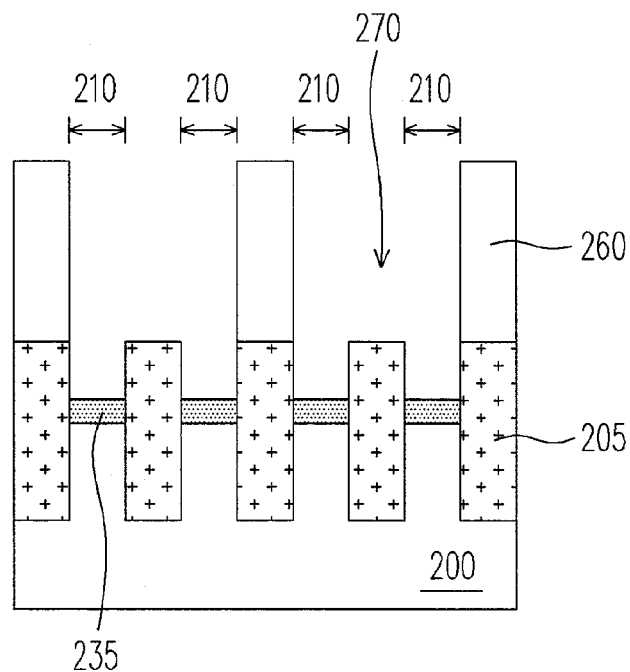

Afterwards, referring to FIG. 2D, FIG. 3D and FIG. 4D, a portion of the inter-layer dielectric layer 260 is removed with use of the patterned mask layer 265 as the mask, such that contact holes 270 are formed. The contact holes 270 expose the source/drain region 235 in the substrate 200 at every two of the adjacent active regions 210 and expose the top portion of each of the isolation structures 205 sandwiched between every two of the adjacent active regions 210 (as shown in FIG. 4D). Here, the method of removing the portion of the inter-layer dielectric layer 260 is, for example, the dry etching method, such as the reactive ion etching method. Thereafter, the patterned mask layer 265 is removed. The patterned mask layer 265 is removed by stripping the photoresist layer 265b through an implementation of a dry photoresist removing method or a wet photoresist removing method. The hard mask layer 265a is then removed by implementing a dry etching method or a wet etching method.

Figure 2E:
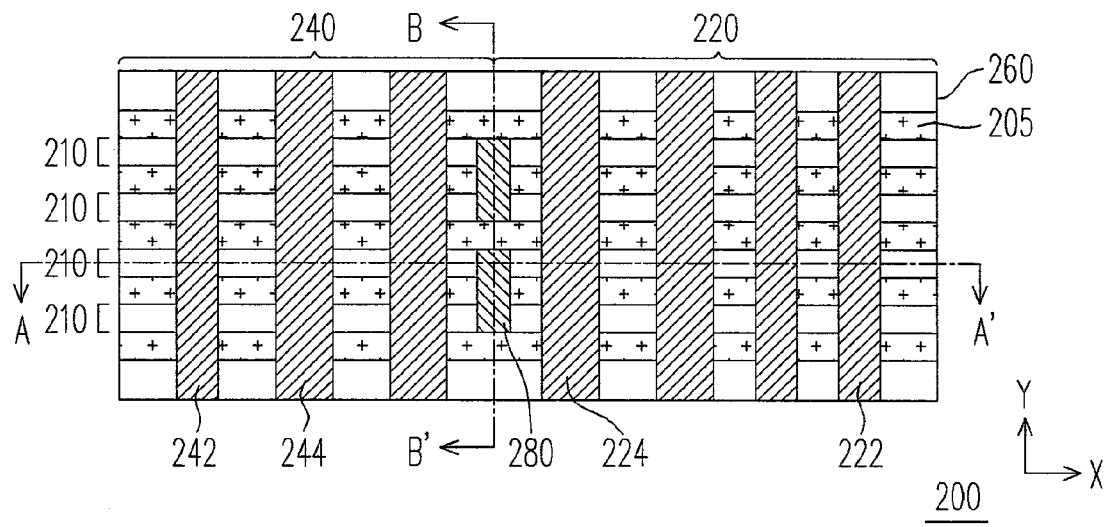
Figure 3E:
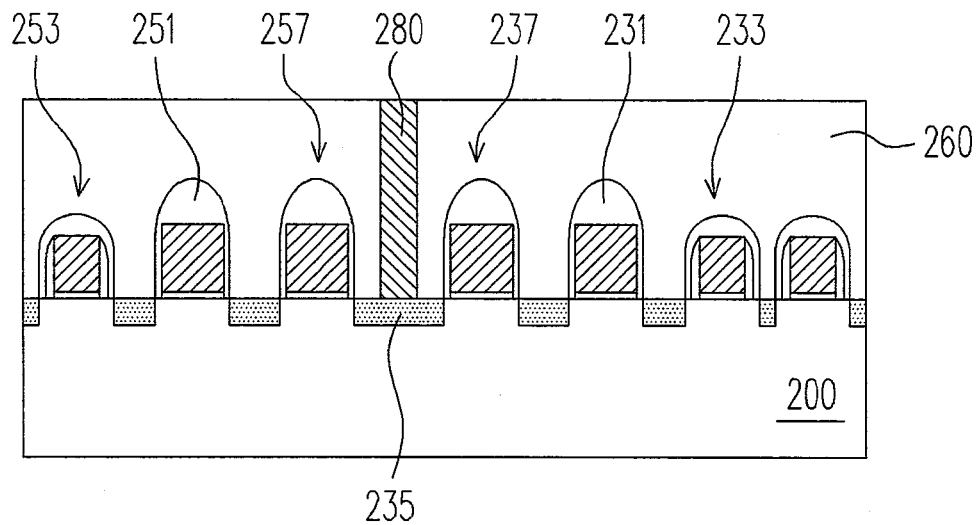
Figure 4E:
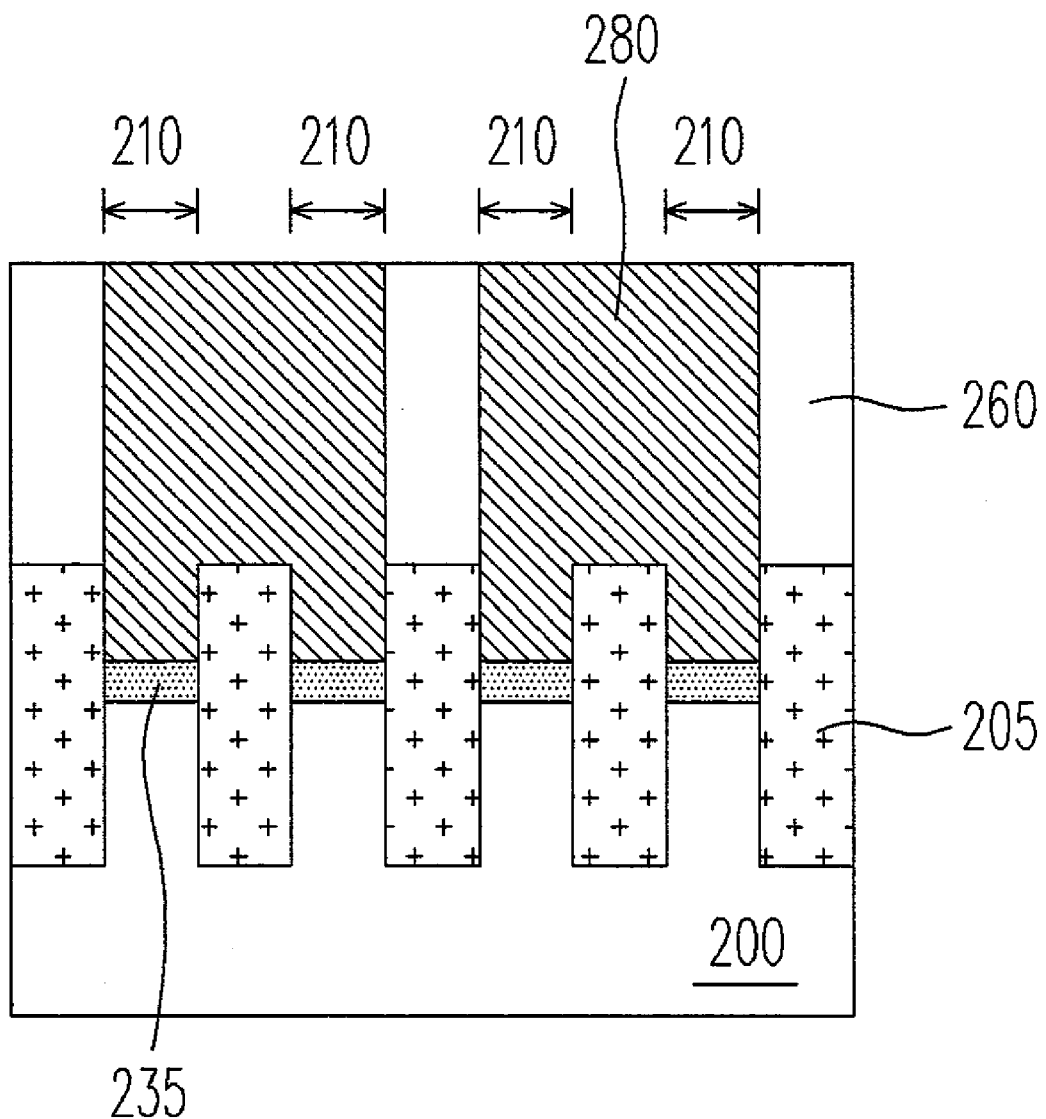

Next, referring to FIG. 2E, FIG. 3E and FIG. 4E, contacts 280 are formed in the contact holes 270. The shape of the contacts 280 is in line with the shape of the contact holes 270. Here, the contacts 280 extends across the isolation structures 205 and connect the source/drain region 235 in the substrate 200 at every two of the adjacent active regions 210. The contacts 280 are formed by firstly forming an entire layer of conductive materials including copper, tungsten, aluminum, silver, or an alloy thereof. The conductive materials are filled into the contact holes 270 and completely cover the inter-layer dielectric layer 260. Superfluous conductive materials disposed over the inter-layer dielectric layer 260 are then removed. In another embodiment, however, during the formation of the contacts 280, conductive lines (not shown) may be simultaneously formed on the inter-layer dielectric layer 260, which is determined upon the device demands.

According to the above manufacturing method of the non-volatile memory, the contacts 280 extending across the isolation structures 205 and connecting the source/drain region 235 in every two of the adjacent active regions 210 are formed. Said layout and the arrangement of the manufacturing process do not require another active region to be additionally disposed between two of the adjacent memory arrays 220 and 240 for the purpose of disposing the contacts 280. Thereby, the chip area occupied by the contacts is significantly reduced, and miniaturization of the devices is promoted. Moreover, only the strip-shaped isolation structures are required to define the active regions, thus reducing the complexity of the manufacturing process of the non-volatile memory.

Figure 2F:
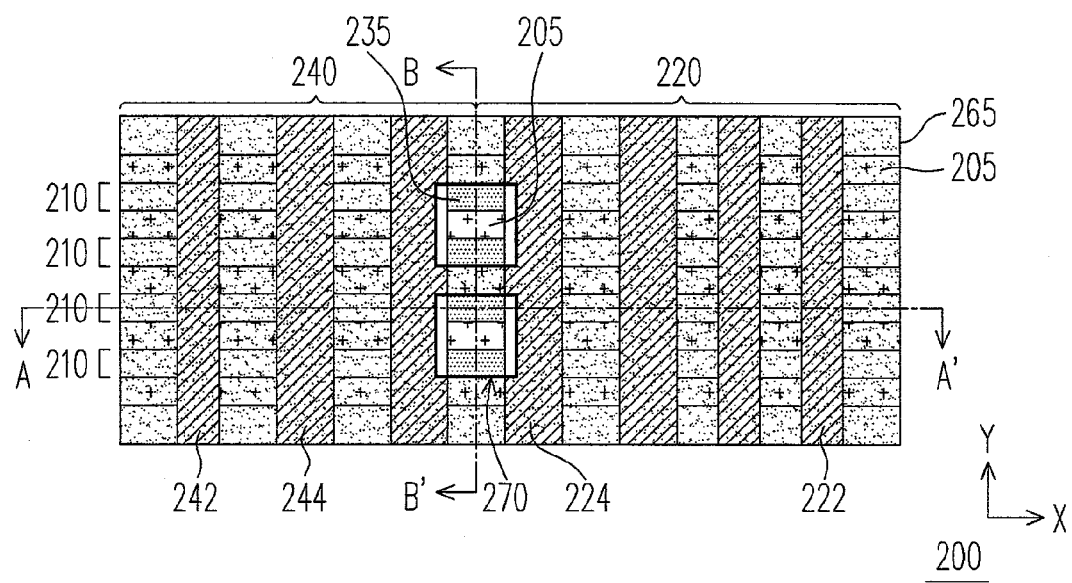
FIG. 2F and FIG. 2G are top views illustrating the manufacturing process of the non-volatile memory according to another embodiment of the invention.
Figure 2G:
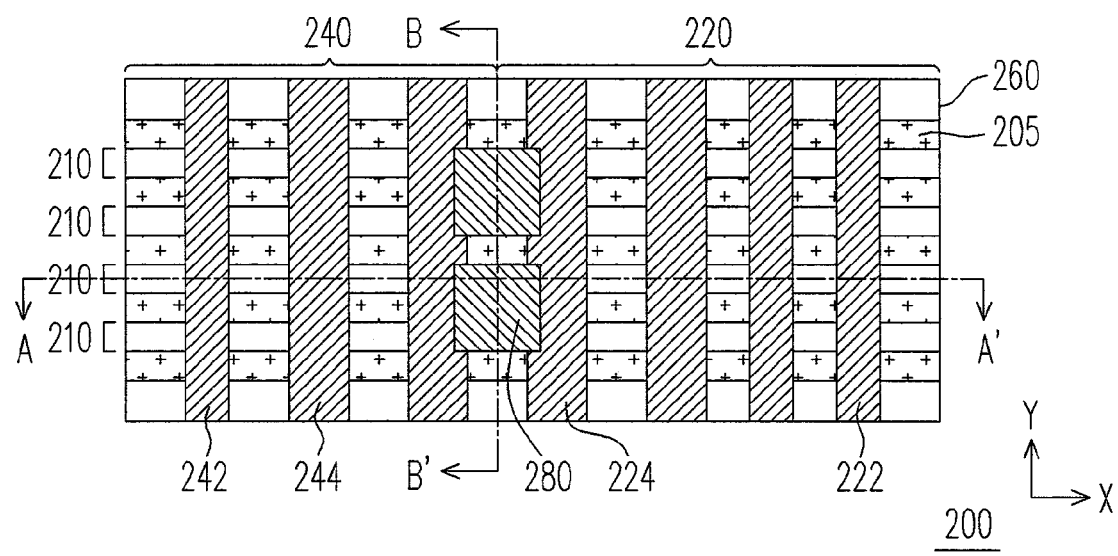
Figure 3F:
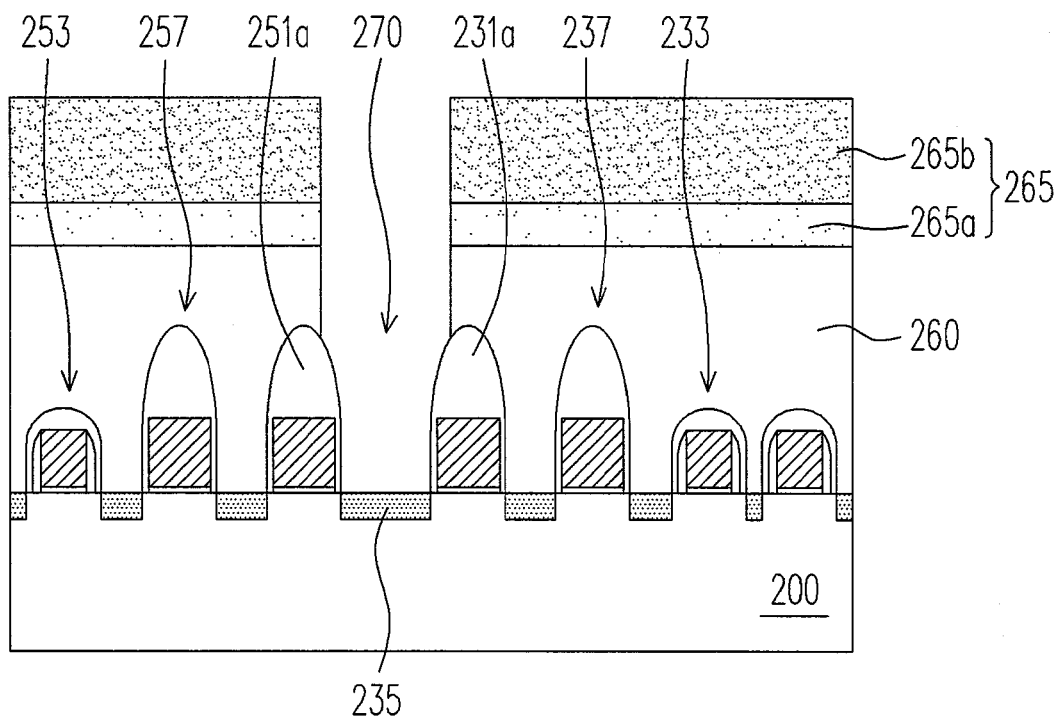
FIG. 3F and FIG. 3G are structural cross-sectional views along the sectional line A-A' depicted in FIG. 2F and FIG. 2G.
Figure 3G:
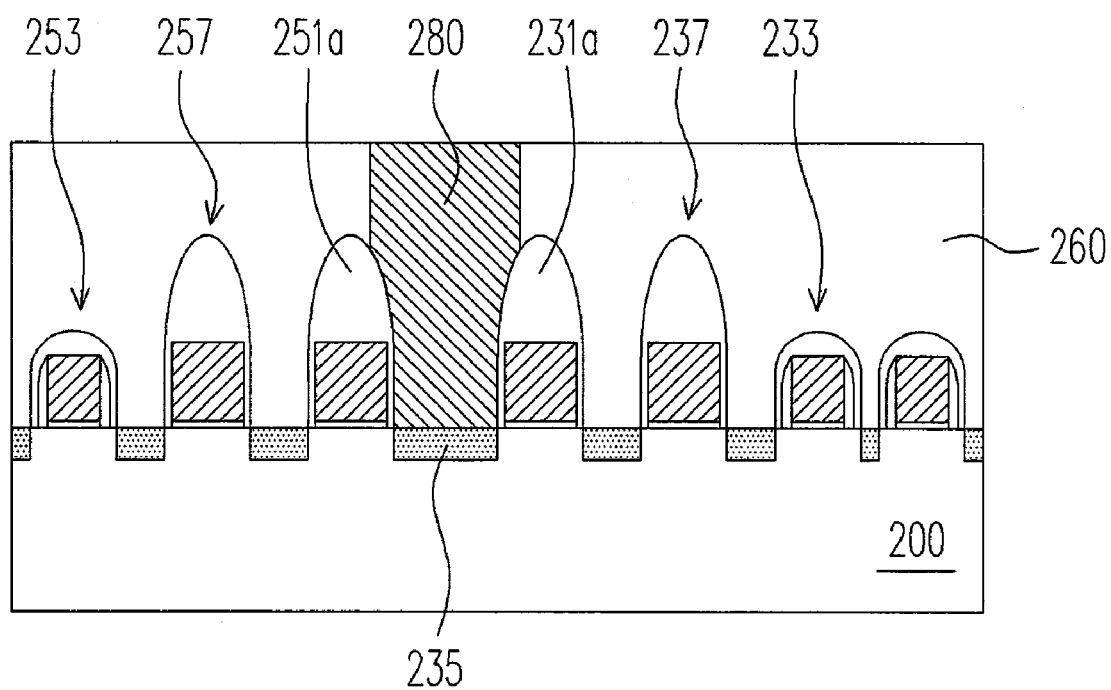

Aside from the above fabricating method, the contacts 280 can also be formed through self-alignment, which will be further elaborated with reference to FIG. 2F, FIG. 2G, FIG. 3F, and FIG. 3G. FIG. 2F and FIG. 2G are depicted following the previous embodiment illustrated in FIG. 2B. FIG. 3F and FIG. 3G are structural cross-sectional views along the sectional line A-A' depicted in FIG. 2F and FIG. 2G. In FIG. 2F, FIG. 2G, FIG. 3F, and FIG. 3G, the components equivalent to those depicted in FIG. 2A through FIG. 2E are labeled identically, while same descriptions are omitted herein.

As illustrated in FIG. 2F and FIG. 3F, the inter-layer dielectric layer 260 and the patterned mask layer 265 are also formed at first according to the embodiment. Next, the contact holes 270 are formed by removing the exposed inter-layer dielectric layer 260 through performing a self-aligned contact etch (SAC) method in which the patterned mask layer 265 is employed as the mask. The patterns of the contact holes 270 provided in the embodiment are different from those given in the previous embodiment. Due to the implementation of the SAC method, the hole dimension of the contact holes 270 in the X-direction can be enlarged to a certain degree even greater than the dimension of the source/drain region 235 in the X-direction. Thereby, the difficulty of performing the photolithography process on the contact holes 270 is reduced, and the process window of the contact holes 270 is then improved. Additionally, during the removal of the portion of the inter-layer dielectric layer 260, cap layers 231a and 251a on the top portions of the select transistors 237 and 257 serve as etching stop layers of the inter-layer dielectric layer 260, so as to prevent the select transistors 237 and 257 from being damaged.

It should be noted that since the cap layers 231a and 251a disposed at the top portions of the select transistors 237 and 257 serve as the etching stop layers in the embodiment, the cap layers 231a and 251a with an increased thickness can be formed during the formation of the select transistors 237 and 257, so as to better protect the select transistors 237 and 257. It is of certainty that the cap layers 231a and 251a should be made of materials having an etching rate less than that of the material of the inter-layer dielectric layer 260. Said materials include silicon nitride, silicon carbide, silicon oxynitride, silicon carbon nitride, and so on, for example.

Thereafter, referring to FIG. 2G and FIG. 3G, the patterned mask layer 265 is removed, and the contacts 280 are formed in the contact holes 270. As the hole dimension of the contact holes 270 in the X-direction is relatively large, the contacts 280 subsequently formed also have an increased dimension in the X-direction. Thereby, the widened contacts 280 are able to promote electrical performance of interconnects.

Note that the contact holes are etched through self-alignment according to the embodiment. Therefore, the distance between the select transistors 237 and 257 (the memory arrays 220 and 240) is further reduced. As such, the occupied chip area can be further decreased, giving rise to miniaturization of the devices.

The structure of a non-volatile memory proposed in an embodiment of the invention is discussed hereinafter. FIG. 2E illustrates the non-volatile memory according to one embodiment of the invention. FIG. 3E and FIG. 4E are structural cross-sectional views along the sectional lines A-A' and B-B' depicted in FIG. 2E, respectively.

As indicated in FIG. 2E, FIG. 3E and FIG. 4E, the non-volatile memory is, for example, disposed on the substrate 200, and includes a plurality of the active regions 210, the memory array 220, and a plurality of the contacts 280.

Here, the active regions 210 are defined by a plurality of the isolation structures 205 disposed in the substrate 200. The isolation structures 205 are the field oxide layers or the STI structures. In the embodiment, the strip-shaped STI structures are taken to exemplify the invention. The strip-shaped isolation structures 205 define the strip-shaped active regions 210. Both of the isolation structures 205 and the active regions 210 are extended to the X-direction and arranged in parallel.

Figure 5A:
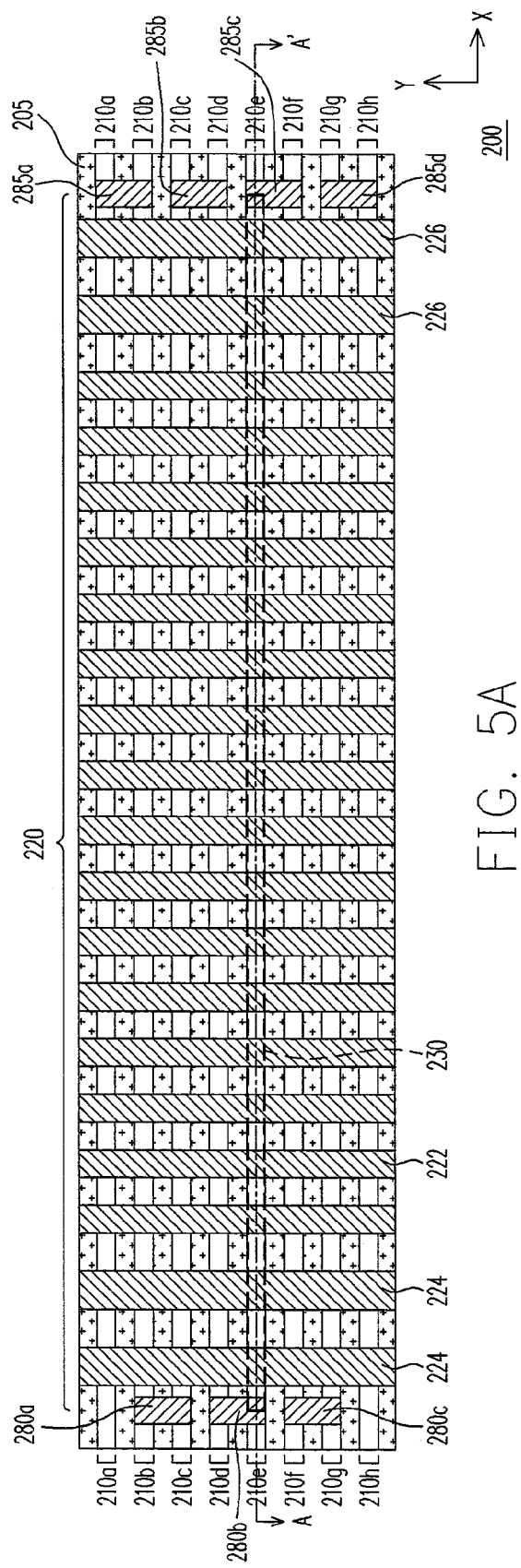
FIG. 5A is a top view of a memory array of the non-volatile memory according to an embodiment of the invention.
Figure 5B:
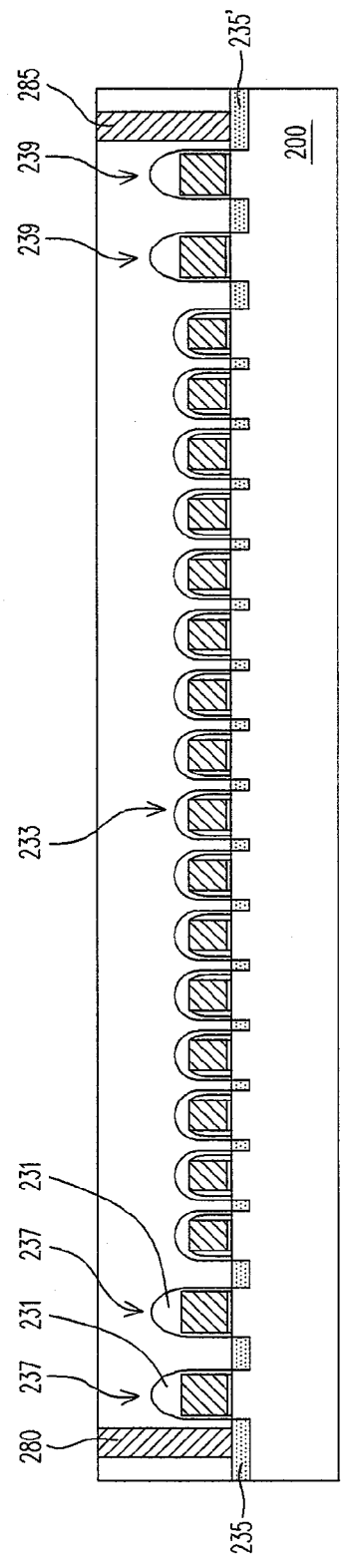
FIG. 5B is a structural cross-sectional view along the sectional line A-A' depicted in FIG. 5A.

The memory array 220 is disposed on the substrate 200 and includes a plurality of the memory cell columns 230, a plurality of the control gate lines 222, and a plurality of the select gate lines 224. The structure of the memory array 220 is not only depicted in FIG. 2B, FIG. 3B and FIG. 4B but also illustrated in FIG. 5A and FIG. 5B. FIG. 5A is a top view of the memory array of the non-volatile memory according to an embodiment of the invention. FIG. 5B is a structural cross-sectional view along the sectional line A-A' depicted in FIG. 5A.

Each of the memory cell columns 230 includes a plurality of the memory cells 233, the source/drain region 230, and a plurality of the select transistors 237. The memory cells 233 are disposed on the substrate 200 at the active regions 210 and connected in series, while the source/drain region 235 is disposed in the substrate 200 outside the memory cells 233. The select transistors 237 are disposed between the source/drain region 235 and the memory cells 233, so as to connect the memory cells 233 to the source/drain region 235. The top portions of the select transistors 237 further include the cap layers 231. The memory cell columns 230 are, for example, the NAND memory cell columns.

Here, the source/drain region 235 is, for example, the p-type source/drain region having the p-type dopants such as boron, $BF_2$, indium, and so forth. Alternatively, the source/drain region 235 is the n-type source/drain region having the n-type dopants such as phosphorus, arsenic, and so on. The source/drain region 235 serves as the source or the drain of each of the memory cell columns 230, for example.

The memory cells 233 may have the stacked gate structure or include the charge trapping layers to trap the electric charges. Various memory cells can be applied to the non-volatile memory of the invention as long as the memory cells are able to store the data which are still retained even after the power supply is cut off.

A plurality of the control gate lines 222 extends across the memory cell columns 230 and is extended to the Y-direction. The Y-direction crosses over the X-direction, and the control gate lines 222 are respectively connected to the memory cells 233 in the Y-direction in series. Besides, a plurality of the select gate lines 224 extends across the active regions 210 and respectively connects the select transistors 237 in the Y-direction in series.

A plurality of the contacts 280 is disposed on the substrate 200 at the active regions 210 and arranged along the Y-direction. Each of the contacts 280 extends across the isolation structures 205 and connects the source/drain region 230 in every two of the adjacent active regions 210. The contacts 280 are made of the conductive materials, such as doped polysilicon, metals, or silicide materials. For example, the contacts 280 can be made of copper, tungsten, aluminum, silver, or an alloy thereof.

Referring to FIGS. 5A and 5B, a source/drain region 235' can be further disposed at another side of the memory cells 233 in the substrate 200. In other words, contacts 285 are, for example, formed on the substrate 200 at another side of the control gate lines 224 in addition to the contacts 280. The contacts 285 extend across the isolation structures 205 and connect the source/drain region 235' in the substrate 200 at every two of the adjacent active regions 210. The contacts 285 and the contacts 280 are, for example, alternately disposed at respective sides of the memory array 220. As indicated in FIG. 5A, contacts 280a, 280b, and 280c are respectively connected to the source/drain region 235 in the substrate 200 at active regions 210b and 210c, active regions 210d and 210e, and active regions 210f and 210g. By contrast, contacts 285a, 285b, 285c, and 285d are respectively connected to the source/drain region 235' in the substrate 200 at the active regions 210a and 210b, the active regions 210c and 210d, the active regions 210e and 210f, and the active regions 210g and 210h. That is to say, the contacts 280 and the contacts 285 alternately extend across the adjacent isolation structures 205.

A plurality of the select transistors 239 is disposed between the memory cells 233 and the source/drain region 235', for example. In the embodiment, sixteen memory cells 233 connected in series are disposed in the memory cell columns 230, for example. Two select transistors 237 and two select transistors 239 are respectively disposed at the two sides of the memory cells 233, so as to connect the memory cells 233 between the source/drain region 235 to the source/drain region 235' in series. Select gate lines 226 are disposed in the Y-direction, for example, so as to connect the select transistors 239 in the Y-direction in series. When the non-volatile memory is operated, different voltages are applied to contacts between the contacts 280, the select gate lines 224, the control gate lines 222, the select gate lines 226 and the contacts 285, so as to program, erase, or read the data stored in the memory cells 233 of the memory array 220.

Referring to FIG. 2E, FIG. 3E and FIG. 4E, the memory array 240 adjacent to the memory array 220 can be further disposed in the non-volatile memory of the embodiment. The memory array 240 and the memory array 220 have the same structure and are mirror symmetrical to each other, for example. The structure of the memory array 240 is already elaborated in the previous embodiment with respect to the manufacturing method of the non-volatile memory, and thus no further description is provided herein.

According to the embodiment, the contacts extend across the isolation structures and connect the source/drain region in the substrate 200 at every two of the adjacent strip-shaped active regions. Hence, the layout space required by the contacts 280 which are arranged in the X-direction and disposed between the select gate lines 244 (adjacent to the memory array 220) and the select gate lines 224 (adjacent to the memory array 240) is determined upon the width of the contacts 280 in the X-direction and upon the resolution of the photolithography process (as illustrated in FIG. 2E). The distance between the select gate lines 244 and the select gate lines 224 is slightly greater than the width of the contacts 280 in the X-direction, for example. As such, said layout is conducive to a reduction of the occupied chip area.

On the other hand, referring to FIG. 2G and FIG. 3G, the top portion of the contacts 280 can be disposed above parts of the select gate lines 244 and 224 according to another embodiment. In other words, it is not necessary to extend the distance between the select gate lines 244 and the select gate lines 224 for the purpose of disposing the contacts 280. Moreover, said distance may be almost equal to the distance between the two select gate lines 244. Thereby, the occupied chip area can be further decreased, and the manufacturing costs are cut down as well.

With the increased capacity of the memories, tens of thousands of memory arrays are often disposed on the same chip. The non-volatile memory provided in the previous embodiments is conducive to a significant reduction of the occupied chip area, satisfying the miniaturization requirement of the devices.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A manufacturing method of a non-volatile memory, comprising the steps of:
    providing a substrate;
    forming a plurality of strip-shaped isolation structures in the substrate to define a plurality of active regions in parallel with the isolation structures and both extended in a first direction, wherein the adjacent active regions are separated from each other by one of the isolation structures;
    forming a first memory array on the substrate, the first memory array comprising:

a plurality of memory cell columns, each of the memory cell columns comprising:
  a plurality of memory cells connected in series with one another and disposed on the substrate in the active regions;
  a source/drain region, disposed in the substrate and outside the memory cells; and
  a plurality of select transistors disposed between the source/drain region and the memory cells to connect the memory cells to the source/drain region in series;
a plurality of control gate lines extending across the memory cell columns and extended in a second direction intersecting the first direction, the control gate lines respectively connecting the memory cells in the second direction in series; and
a plurality of first select gate lines extending across the active regions and respectively connecting the select transistors in the second direction in series; and
forming a plurality of first contacts on the substrate at a side of the first memory array, the first contacts being arranged along the second direction and each of the first contacts extending across one of the isolation structures and connecting the source/drain regions in every two of the adjacent active regions in the substrate.

2. The manufacturing method of the non-volatile memory as claimed in claim 1, wherein the first contacts forming step comprises:
  forming an inter-layer dielectric layer on the substrate to cover the first memory array;
  forming a plurality of contact holes in the inter-layer dielectric layer to at least expose a portion of the two source/regions in every two of the adjacent active regions and the isolation structures sandwiched between the two active regions; and
  filling the contact holes with conductive materials.

3. The manufacturing method of the non-volatile memory as claimed in claim 1, further comprising forming a second memory array to connect to the first memory array during the formation of the first memory array, the second memory array being mirror symmetrical to the first memory array with respect to the first contacts.

4. The manufacturing method of the non-volatile memory as claimed in claim 3, wherein the second memory array comprises a plurality of second select gate lines formed on the substrate and is symmetrical to the first select gate lines.

5. The manufacturing method of the non-volatile memory as claimed in claim 3, wherein the first memory array and the second memory array share the source/drain region.

6. The manufacturing method of the non-volatile memory as claimed in claim 3, wherein, after the formation of the first memory array and the second memory array, the first contacts forming step comprises:
  forming a mask layer on the substrate to cover the first memory array and the second memory array;
  removing a portion of the mask layer and forming a plurality of contact holes at least exposing the source/drain region between the first memory array and the second memory array; and
  forming the first contacts through self-alignment,
  wherein a spacer is formed on sidewalls of the first select gate lines and the second select gate lines, and a material of the mask layer comprises silicon nitride.

* * * * *